United States Patent
Mouli

(10) Patent No.: US 7,667,250 B2
(45) Date of Patent: Feb. 23, 2010

(54) VERTICAL GATE DEVICE FOR AN IMAGE SENSOR AND METHOD OF FORMING THE SAME

(75) Inventor: Chandra Mouli, Boise, ID (US)

(73) Assignee: Aptina Imaging Corporation, Grand Cayman (KY)

( * ) Notice: Subject to any disclaimer, the term of this patent is extended or adjusted under 35 U.S.C. 154(b) by 39 days.

(21) Appl. No.: 10/892,368

(22) Filed: Jul. 16, 2004

(65) Prior Publication Data

US 2006/0011919 A1    Jan. 19, 2006

(51) Int. Cl.
*H01L 27/146* (2006.01)
(52) U.S. Cl. .............................. 257/292; 257/E27.133
(58) Field of Classification Search .............. 250/208.1;
348/313; 257/290–292, 329–333, 444, 461,
257/462, 233, E27.133
See application file for complete search history.

(56) References Cited

U.S. PATENT DOCUMENTS

| | | | |
|---|---|---|---|
| 6,027,975 A | | 2/2000 | Hergenrother et al. |
| 6,225,661 B1 * | | 5/2001 | An et al. ..................... 257/336 |
| 6,300,199 B1 | | 10/2001 | Reinberg |
| 6,320,221 B1 * | | 11/2001 | Choi et al. .................. 257/330 |
| 6,372,559 B1 | | 4/2002 | Crowder et al. |
| 6,518,622 B1 | | 2/2003 | Chew et al. |
| 6,521,924 B2 * | | 2/2003 | Han et al. ................... 257/290 |
| 6,548,872 B2 | | 4/2003 | Reinberg |
| 6,635,924 B1 | | 10/2003 | Hergenrother et al. |
| 6,661,459 B1 * | | 12/2003 | Koizumi et al. ............. 348/310 |
| 6,664,143 B2 | | 12/2003 | Zhang |
| 6,686,604 B2 | | 2/2004 | Layman et al. |
| 6,690,040 B2 | | 2/2004 | Chaudhry et al. |
| 6,794,699 B2 * | | 9/2004 | Bissey et al. ................ 257/296 |
| 6,906,364 B2 * | | 6/2005 | Chen et al. .................. 257/292 |
| 2002/0060338 A1 | | 5/2002 | Zhang |
| 2003/0047749 A1 | | 3/2003 | Chaudhry et al. |
| 2003/0060015 A1 | | 3/2003 | Layman et al. |
| 2003/0064567 A1 | | 4/2003 | Chaudhry et al. |
| 2003/0119237 A1 | | 6/2003 | Chittipeddi et al. |
| 2003/0136978 A1 | | 7/2003 | Takaura et al. |
| 2004/0041188 A1 * | | 3/2004 | Bissey et al. ................ 257/297 |
| 2004/0065808 A1 * | | 4/2004 | Kochi et al. ............... 250/214.1 |
| 2005/0208769 A1 * | | 9/2005 | Sharma ...................... 438/700 |

FOREIGN PATENT DOCUMENTS

JP    07297406 A  * 11/1995

OTHER PUBLICATIONS

Hergenrother, J. M. et al.—"The Vertical Replacement-Gate (VRG) MOSFET: A 50-nm Vertical MOSFET with Lithography-Independent Gate Length," proceedings of the IEDM, Dec. 20, pp. 65-68.

* cited by examiner

*Primary Examiner*—Marcos D. Pizarro
(74) *Attorney, Agent, or Firm*—Dickstein Shapiro LLP

(57) ABSTRACT

A CMOS pixel cell having a charge transfer transistor adjacent the photo-conversion device. The transistor has a channel region surrounded by a gate and an upper source/drain region over the channel region.

27 Claims, 15 Drawing Sheets

US 7,667,250 B2

VERTICAL GATE DEVICE FOR AN IMAGE SENSOR AND METHOD OF FORMING THE SAME

FIELD OF THE INVENTION

The present invention relates generally to the field of semiconductor devices and more particularly to a pixel cell with an improved transistor gate device.

BACKGROUND OF THE INVENTION

CMOS image sensors are increasingly being used as low cost imaging devices. A CMOS image sensor circuit includes a focal plane array of pixel cells, each one of the cells includes a photogate, photoconductor, or photodiode having an associated charge accumulation region within a substrate for accumulating photo-generated charge. Each pixel cell may include a transistor for transferring charge from the charge accumulation region to a sensing node, and a transistor, for resetting the sensing node to a predetermined charge level prior to charge transference. The pixel cell may also include a source follower transistor for receiving and amplifying charge from the sensing node and an access transistor for controlling the readout of the cell contents from the source follower transistor.

In a CMOS image sensor, the active elements of a pixel cell perform the necessary functions of: (1) photon to charge conversion; (2) accumulation of image charge; (3) transfer of charge to the sensing node accompanied by charge amplification; (4) resetting the sensing node to a known state before the transfer of charge to it; (5) selection of a pixel for readout; and (6) output and amplification of a signal representing pixel charge from the sensing node.

CMOS image sensors of the type discussed above are generally known as discussed, for example, in Nixon et al., "256×256 CMOS Active Pixel Sensor Camera-on-a-Chip," IEEE Journal of Solid-State Circuits, Vol. 31(12), pp. 2046-2050 (1996); and Mendis et al., "CMOS Active Pixel Image Sensors," IEEE Transactions on Electron Devices, Vol. 41(3), pp. 452-453 (1994). See also U.S. Pat. Nos. 6,177,333 and 6,204,524, which describe operation of conventional CMOS image sensors and are assigned to Micron Technology, Inc., the contents of which are incorporated herein by reference.

A schematic diagram of a conventional CMOS pixel cell 10 is shown in FIG. 1A. FIG. 1B is a top plan view of the conventional pixel cell 10. The illustrated CMOS pixel cell 10 is a four transistor (4T) cell. The CMOS pixel cell 10 generally comprises a photo-conversion device 21 for generating and collecting charge generated by light incident on the pixel cell 10, and a transfer transistor 24 for transferring photoelectric charges from the photo-conversion device 21 to a sensing node, typically a floating diffusion region 15. The floating diffusion region 15 is electrically connected to the gate of an output source follower transistor 26, typically by a metal line 20 and contacts 23. The pixel cell 10 also includes a reset transistor 25 for resetting the floating diffusion region 15 to a predetermined voltage; and a row select transistor 27 for outputting signals from the source follower transistor 26 to an output terminal in response to an address signal. As shown in FIG. 1B, the reset transistor 25, source follower transistor 26, and row select transistor 27 each include a gate stack 29 and respective source/drain regions 22.

FIG. 1C is a cross-sectional view of a portion of the pixel cell 10 along the line 1C-1C'. As shown in FIG. 1C, the exemplary CMOS pixel cell 10 has a pinned photodiode as the photo-conversion device 21. The photodiode 21 uses a p-n-p construction comprising a p-type surface layer 14 and an n-type photodiode region 16 within a p-type active layer 11. The photodiode 21 is adjacent to and partially underneath the transfer transistor 24. The transfer transistor 24, as well as the other transistors 25, 26, 27, includes a gate stack 29. The gate stack 29 typically includes a gate dielectric layer 17, a gate electrode 18, a dielectric layer 19 and sidewall spacers 13. Typically, the gate electrode 18 is a planar layer.

In the CMOS pixel cell 10 depicted in FIGS. 1A-1C, electrons are generated by light incident on the photo-conversion device 21 and are stored in the n-type photodiode region 16. These charges are transferred to the floating diffusion region 15 by the transfer transistor 24 when the transfer transistor 24 is activated. The source follower transistor 26 produces an output signal from the transferred charges. A maximum output signal is proportional to the number of electrons extracted from the n-type photodiode region 16. The row select transistor 27 is operational to allow the source follower transistor 26 to output a reset signal $V_{rst}$ when the reset transistor 25 resets the floating diffusion region 15, and a light received signal $V_{photo}$ when charge is transferred from the photodiode region 16 to the floating diffusion region 15.

When pixel cells 10 are scaled to smaller sizes (e.g., below 2 $\mu m^2$), conventional transfer transistors 24 having planar gate electrodes 18 have difficulty fully transferring charge from the photo-conversion device 21. Factors reducing the charge transfer efficiency include the presence of potential barrier/wells near the transfer gate stack 29 region in the substrate 11, the threshold voltage of the transfer gate stack 29, and the reduced width of the transfer gate electrode 18. When pixel cells 10 are scaled, the transfer gate electrode 18 width and length, and oxide layer 17 thickness are correspondingly reduced. Unfortunately, at a particular operating voltage Vcc, reducing the gate width leads to poor charge transfer efficiency, while reducing the gate length leads to short-channel effects. Reducing the gate dielectric thickness, however, improves the gate overdrive, but care must be taken to maintain the gate dielectric 17 integrity.

It is desirable, therefore, to have an improved pixel cell that could be scaled to smaller sizes while maintaining efficient charge transfer.

BRIEF SUMMARY OF THE INVENTION

Exemplary embodiments of the invention provide a CMOS pixel cell having a charge transfer transistor adjacent a photo-conversion device. The transistor has a channel region surrounded by a gate and an upper source/drain region over the channel region.

BRIEF DESCRIPTION OF THE DRAWINGS

The foregoing and other aspects of the invention will be better understood from the following detailed description of the invention, which is provided in connection with the accompanying drawings, in which.

DETAILED DESCRIPTION OF THE INVENTION

Figure 1A:
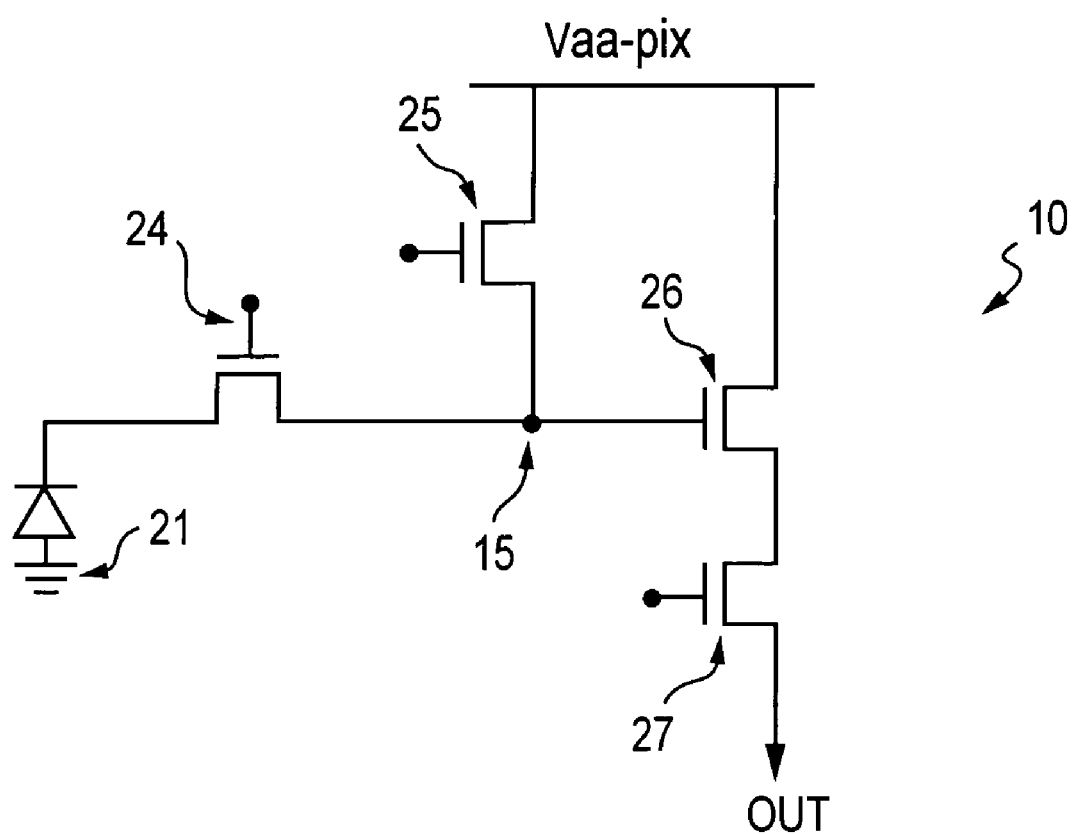
FIG. 1A is a schematic diagram of an exemplary conventional CMOS pixel cell.

In the following detailed description, reference is made to the accompanying drawings, which form a part hereof and illustrate specific embodiments in which the invention may be practiced. In the drawings, like reference numerals describe substantially similar components throughout the several views. These embodiments are described in sufficient detail to enable those skilled in the art to practice the invention, and it is to be understood that other embodiments may be utilized, and that structural, logical and electrical changes may be made without departing from the spirit and scope of the present invention.

The terms "wafer" and "substrate" are to be understood as including silicon, silicon-on-insulator (SOI), silicon-on-sapphire (SOS), and silicon-on-nothing (SON) technology, doped and undoped semiconductors, epitaxial layers of silicon supported by a base semiconductor foundation, and other semiconductor structures. Furthermore, when reference is made to a "wafer" or "substrate" in the following description, previous process steps may have been utilized to form regions or junctions in the base semiconductor structure or foundation. In addition, the semiconductor need not be silicon-based, but could be based on silicon-germanium, germanium, or gallium-arsenide.

The term "pixel" or "pixel cell" refers to a picture element unit cell containing a photo-conversion device and transistors for converting electromagnetic radiation to an electrical signal. For purposes of illustration, a representative pixel cell is illustrated in the figures and description herein, and typically fabrication of all pixel cells in an image sensor will proceed concurrently and in a similar fashion.

Figure 2A:
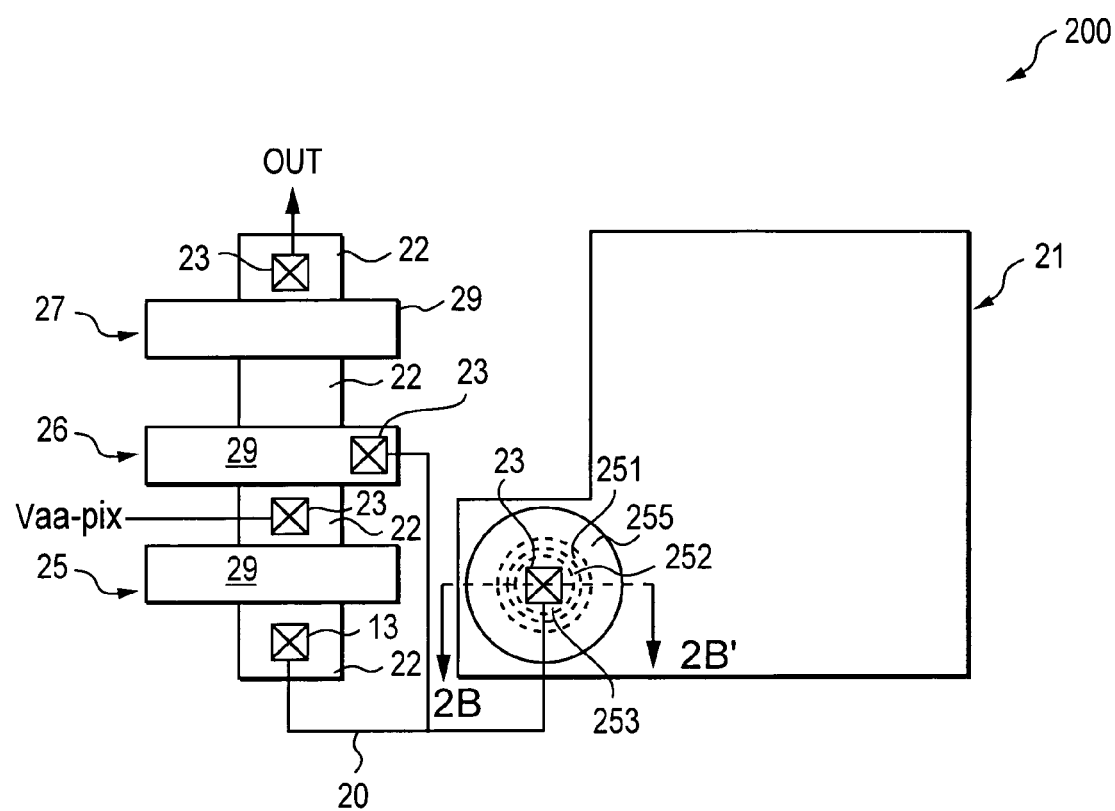
FIG. 2A is a top plan view of the pixel cell of FIG. 2A.
Figure 2B:
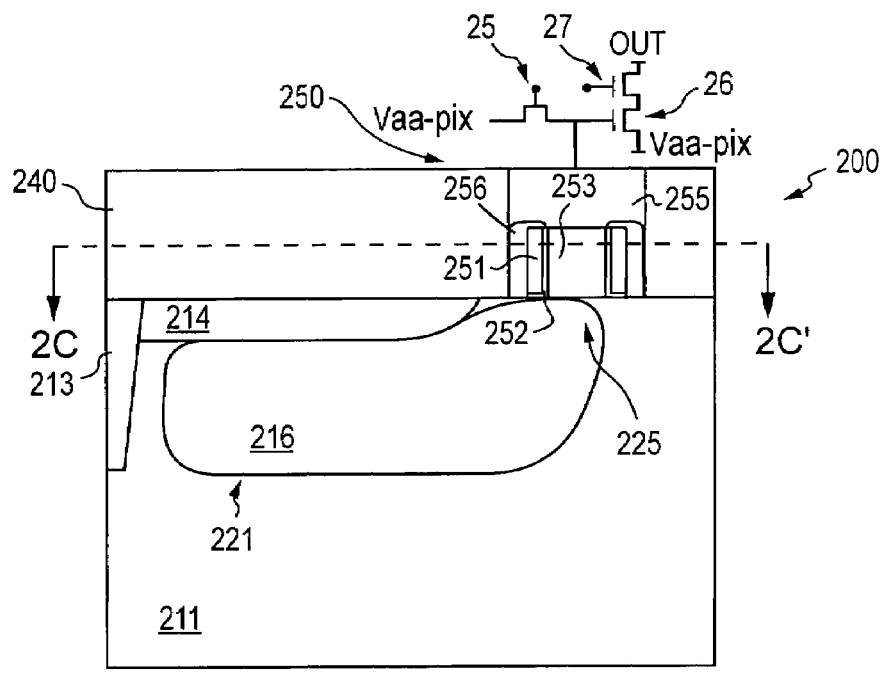
FIG. 2B is a cross-sectional view of a portion of the pixel cell of FIG. 2A.

FIG. 2A is a top plan view of a pixel cell 200 constructed according to an exemplary embodiment of the invention. In FIG. 2A and other figures, broken lines depict underlying structures. FIG. 2B is a cross-sectional view of the pixel cell 200 along the line 2B-2B'.

Figure 1B:
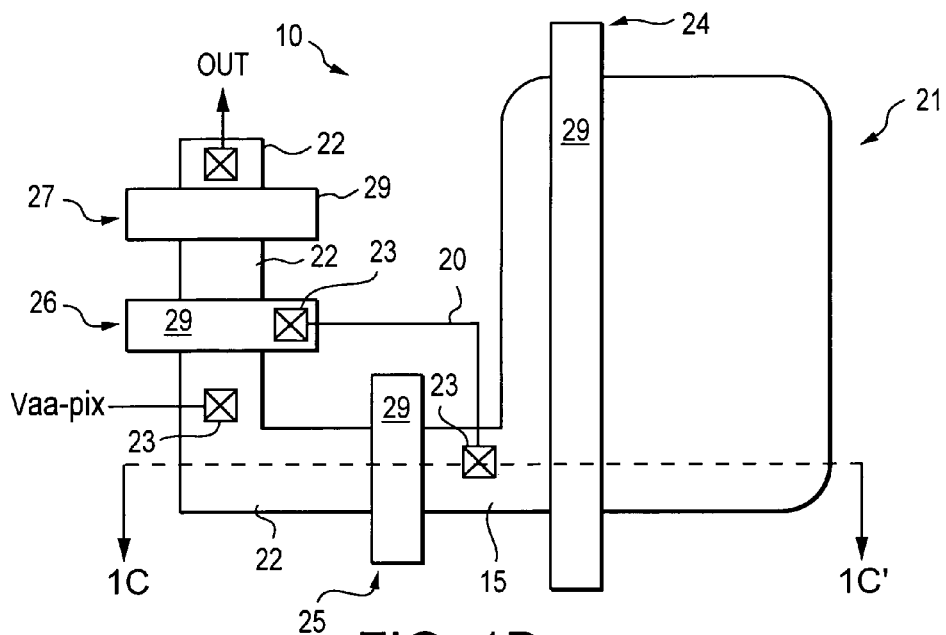
FIG. 1B is a top plan view of the conventional pixel cell of FIG. 1.

Illustratively, the pixel cell 200 is a four-transistor (4T) cell, similar to the conventional pixel cell 10 (FIG. 1A). Accordingly, the pixel cell 200 includes conventional planar reset transistor 25, source follower transistor 26, and row select transistor 27. The pixel cell 200, however, includes a transfer transistor 250 that has a vertical gate 251 as opposed to the conventional planar gate electrode 18 (FIG. 1B). Since the transfer transistor 250 has a vertical gate structure, the floating diffusion region 255 is positioned over the gate 251 and channel region. As shown in FIG. 2A, the floating diffusion region 255 is connected to a source/drain region 22 of the reset transistor 25, for example, by a metal line 20, and contacts 23.

The gate 251 wraps around the channel region that is in the form of a pillar 253 extending above the top surface of the substrate 211. Between the gate 251 and the pillar 253 is a gate dielectric layer 252 that also wraps around the pillar 253. Similarly to a planar transfer gate electrode 18, the gate 251 is coupled to control circuitry (not shown) and receives a control signal which activates the gate 251 during operation.

Figures 2C, 2D:
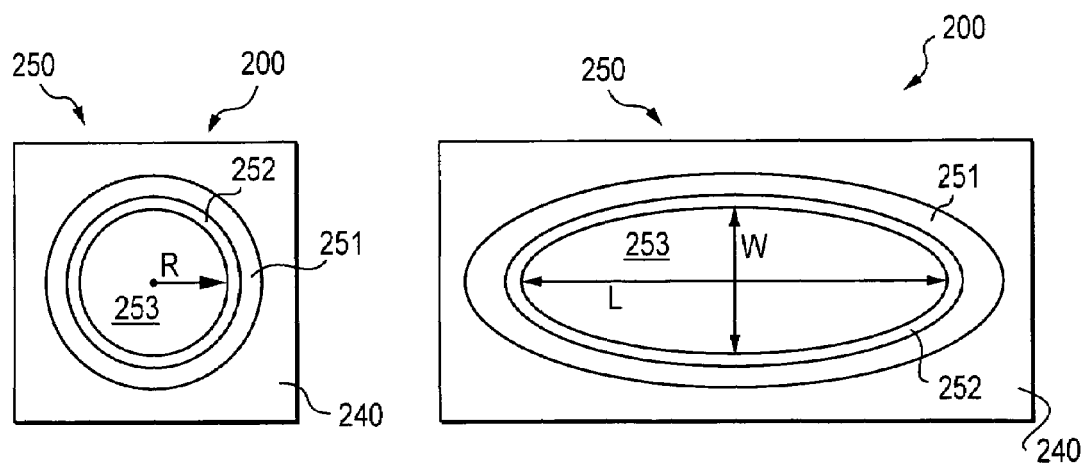
FIG. 2C is a cross-sectional views of a portion of the pixel cell of FIG. 2B.
FIG. 2D is a cross-sectional view of a portion of a pixel cell according to another exemplary embodiment of the invention.

FIG. 2C is a cross sectional view of the pixel cell 200 along the line 2C-2C'. As shown in FIG. 2C, the pillar 253 can have an approximately circular cross-sectional shape with a radius R. The shape of the pillar 253 can be approximately circular, as irregularities can occur during the fabrication process. Alternatively, as depicted in FIG. 2D, the pillar 253 can have an approximately oval cross-sectional shape. When the pillar 253 is approximately oval-shaped, it has a length L and width W. The pillar 253 is oriented such that the view of FIG. 2A is a cross-sectional view along the width W of the pillar 253. Preferably, the length L extends over and adjacent an edge of the photodiode charge collection region 216.

The pixel cell 200 including a transfer transistor 250 having a vertical gate 251 structure provides advantages over the conventional pixel cell 10 (FIG. 1A). The vertical gate structure for the transfer transistor 250 permits a higher density of devices within the pixel cell 200 since the gate 251 occupies less surface area of the substrate 211. Also, since the gate 251 width is the perimeter of the oval or cylinder, there is an increased effective gate 251 width as compared to a conventional planar transfer transistor 24. The vertical gate 251 provides better gate 251 control of the channel (i.e., pillar 253) and reduced drain induced barrier lowering, which can result in a good sub-threshold slope. Also, the gate 251 can allow a substantial reduction or almost complete elimination of the potential barrier in the area where the transfer gate 251 and photodiode 221 are in close proximity, as in the area of the source/drain junction 225.

Figure 1C:
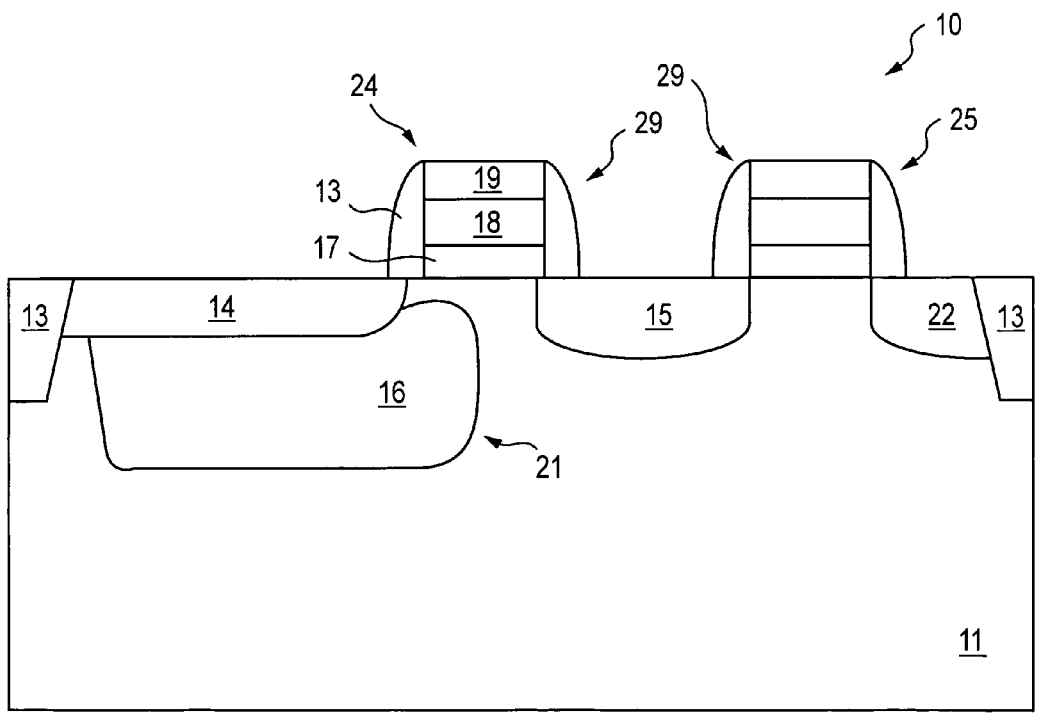
FIG. 1C is a cross-sectional view of the FIG. 1 pixel cell.

The transfer transistor 250 can have no or minimal channel 253 dopant concentration to create a fully-depleted device structure. The lack of or low dopant concentration in the channel 253 serves to enhance charge carrier mobility. Additionally, charge carrier mobility can be further increased since carrier transport is along <110> and <111> crystallographic planes instead of <100> as in a planar device 24 (FIGS. 1A-1C).

It should be appreciated that the configuration of the illustrated pixel cell 200 is exemplary and that various changes may be made such that the pixel cell 200 may have other configurations. For example, although the invention is described in connection with a four-transistor (4T) pixel cell 200, the invention may also be incorporated into other pixel circuits having different numbers of transistors. Without being limiting, such pixel circuits may include five-transistor (5T) and six-transistor (6T) pixel cells. The 5T and 6T pixel cells differ from the 4T pixel cell by the addition of one or two transistors, respectively, such as a shutter transistor and an anti-blooming transistor.

FIGS. 3A-3M depict the formation of the pixel cell 200 according to an exemplary embodiment of the invention. No particular order is required for any of the actions described herein, except for those logically requiring the results of prior actions. Accordingly, while the actions below are described as being performed in a general order, the order is exemplary only and can be altered.

Figure 3A:
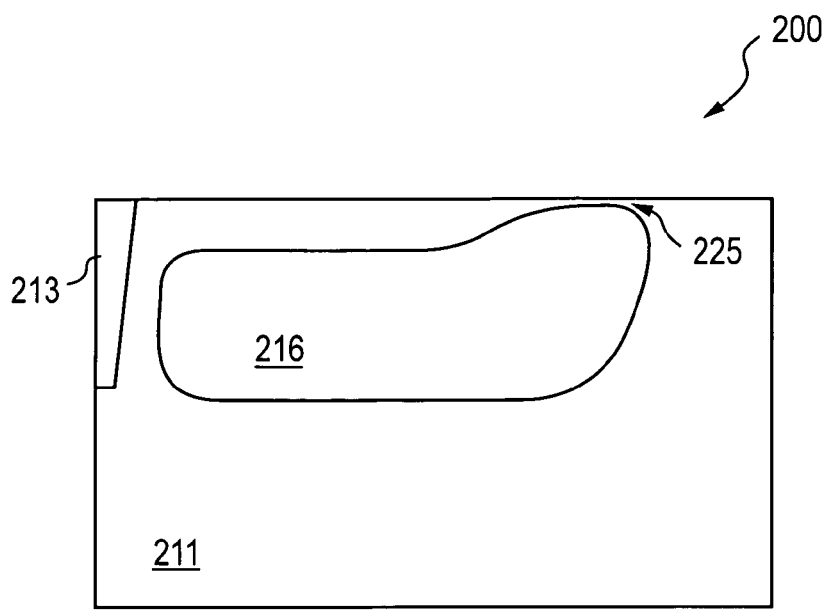
FIG. 3A depicts the pixel cell of FIG. 2A at an initial stage of processing.

FIG. 3A illustrates the formation of isolation regions 213 and the n-type photodiode region 216 in the substrate 211. For exemplary purposes, the substrate 211 is a silicon substrate slightly doped with a p-type dopant. As noted above, however, the invention has application to other semiconductor substrates.

The isolation region 213 is formed within the substrate 211 and filled with a dielectric material, which may be an oxide material, for example a silicon oxide, such as SiO or $SiO_2$; oxynitride; a nitride material, such as silicon nitride; silicon carbide; a high temperature polymer; or other suitable dielectric material. Preferably, as shown in FIG. 3A, the isolation region 213 is a shallow trench isolation (STI) region and the dielectric material is a high density plasma (HDP) oxide, a material which has a high ability to effectively fill narrow trenches.

The n-type photodiode region 216 is implanted in the substrate 211 adjacent to an STI region 213 as a lightly doped n-type region. For example, a layer of photoresist (not shown) can be patterned over the substrate 211 having an opening over the surface of the substrate 211 where pinned photodiode 221 is to be formed. An n-type dopant, such as phosphorus, arsenic, or antimony, may be implanted through the opening and into the substrate 211. Multiple implants may be used to tailor the profile of region 216. If desired, an angled implantation may be conducted to form the doped region 216 such that implantation is carried out at angles other than 90 degrees relative to the surface of the substrate 211.

A source/drain junction 225 between where the pillar 253 (FIG. 2B) will be formed and the n-type photodiode region 216 is heavily doped and shallow. Preferably, the source/drain junction 225 has an active dopant concentration greater than approximately $1\times10^{17}$ atoms/cm$^3$ and is formed by a low energy implant, e.g., less than 5 keV, or by the diffusion of dopants from a solid-source. By keeping the source/drain junction 225 heavily doped and shallow, the existence of potential barriers in this area can be minimized during operation.

Figure 3B:
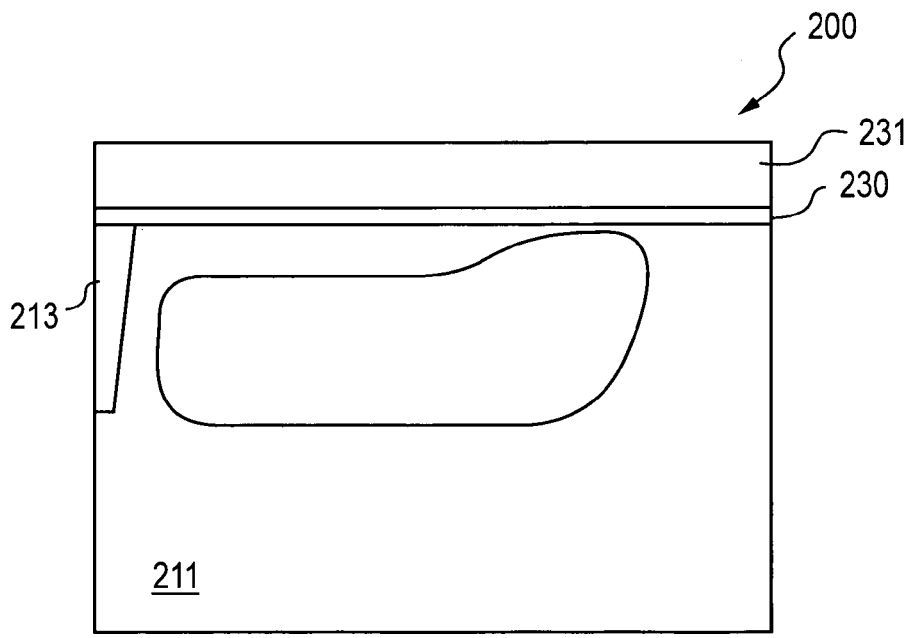
FIGS. 3B-3M depict the pixel cell of FIG. 2A at intermediate stages of processing.

FIG. 3B depicts the formation of a pad oxide layer 230 over the substrate 211 and a hard mask 231 over the pad oxide layer 230. The pad oxide layer 230 and hard mask 231 can be formed by any known technique. In the illustrated exemplary embodiment, the pad oxide layer 230 is a layer of silicon oxide grown on the substrate 211 to a thickness within the range of approximately 40 Angstroms (Å) to approximately 100 Å. The hard mask 231 can be any suitable material deposited on the pad oxide layer 230 to a particular thickness. Illustratively, the thickness is between approximately 500 Å to approximately 4000 Å. In the illustrated embodiment, the hard mask 231 is a nitride layer.

Figure 3C:
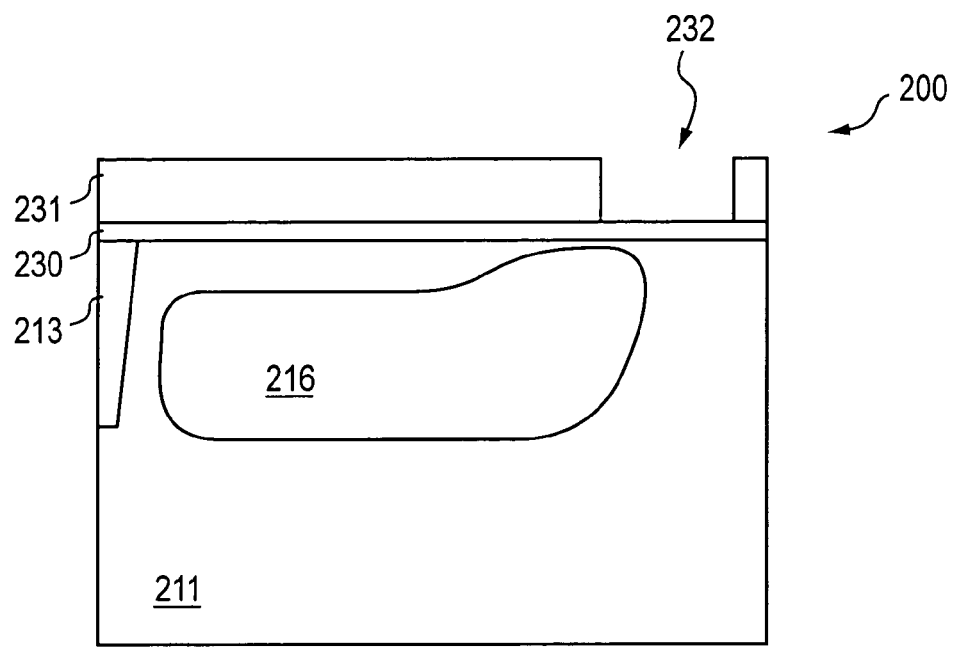

As shown in FIG. 3C, a trench 232 (or opening) is formed in the nitride layer 231 exposing the pad oxide layer 230. The trench 232 can be formed by patterning and etching the nitride layer 231 by any known technique such that the trench 231 stops at the oxide layer 230. The trench 232 is formed to accommodate the desired shape of the transfer gate 251, gate dielectric layer 252, and pillar 253 (FIGS. 2A-2C).

Figure 3D:
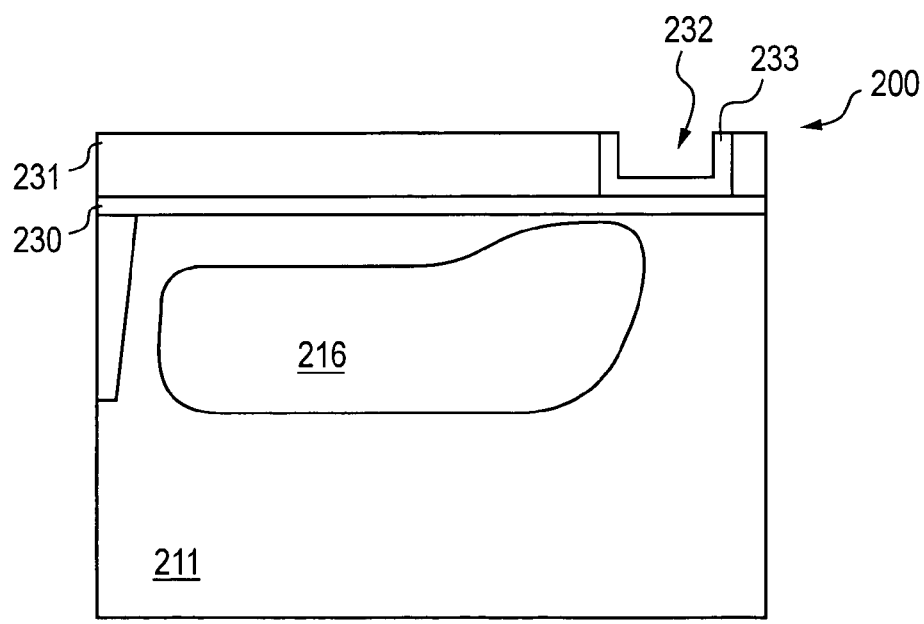
Figure 3E:
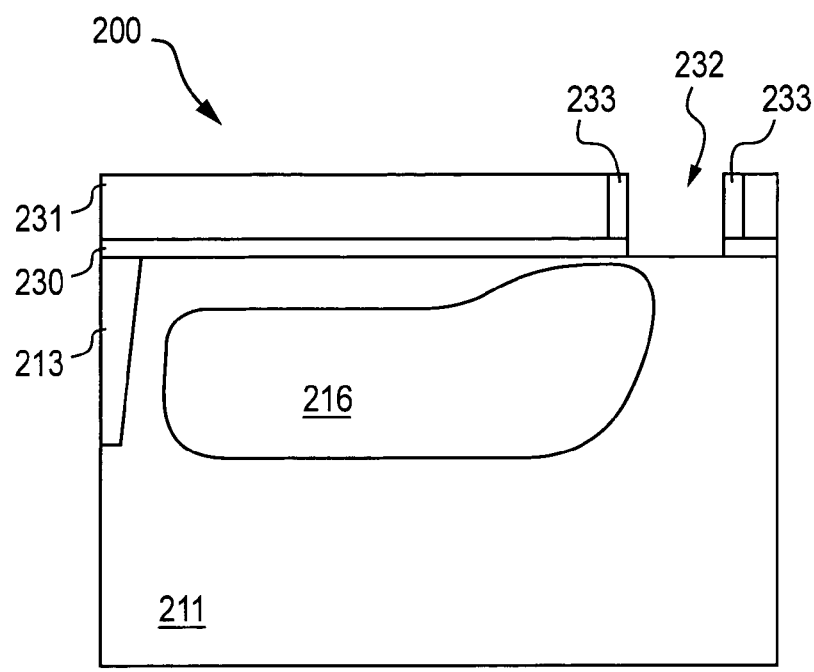

An oxide spacer 233 is deposited in the trench 232, as shown in FIG. 3D. The oxide spacer 233 will be subsequently removed and can be any suitable oxide. As shown in FIG. 3E, the portions of the pad oxide layer 230 and oxide spacer 233 at the bottom of the trench 232 are removed to expose the substrate 211. This can be accomplished, for example, using a wet clean step. The oxide spacer 233 on the sidewalls of the trench 232 remains. The thickness of the remaining oxide spacer 233 is approximately equal to the desired thickness of the gate dielectric 252 and gate 251 (FIGS. 2A-2C).

Figure 3F:
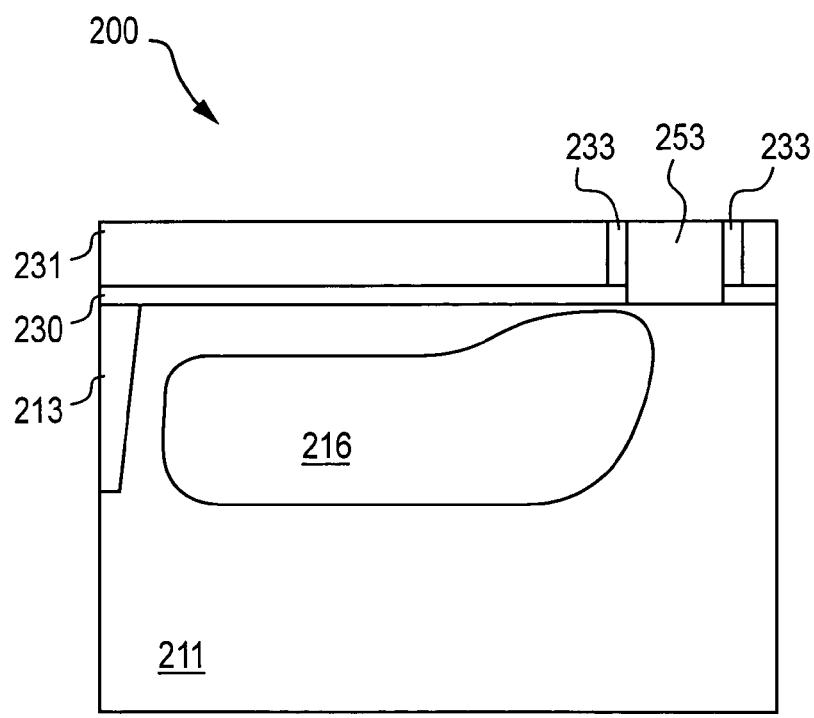

A silicon pillar 253 is formed in the trench 232, as depicted in FIG. 3F. In the illustrated embodiment, epitaxial silicon is grown to fill the empty portions of the trench 232. When the pillar has a circular cross-sectional shape the radius R (FIG. 2C) of the pillar can be approximately 200 Å to approximately 800 Å. When the pillar has an approximately oval cross-sectional shape the width W (FIG. 2D) of the pillar can be between approximately 300 Å to approximately 1000 Å. Although the invention is described in connection with an approximately oval or approximately circular cross-sectional shaped pillar 253, the invention can include other shapes, such as an approximately rectangular cross-sectional shaped pillar 253.

If desired, a channel implant can also be conducted to implant a p-type dopant into the pillar 253. Any suitable known technique may be used to dope the pillar 253 if desired. As noted above, however, the channel implant may also be skipped.

A chemical mechanical polish (CMP) step is performed to planarize the pillar 253, stopping at the nitride layer 231. As noted above in connection with FIGS. 2A-2C, the pillar 253 serves as the channel region of the transfer transistor 250.

Figure 3G:
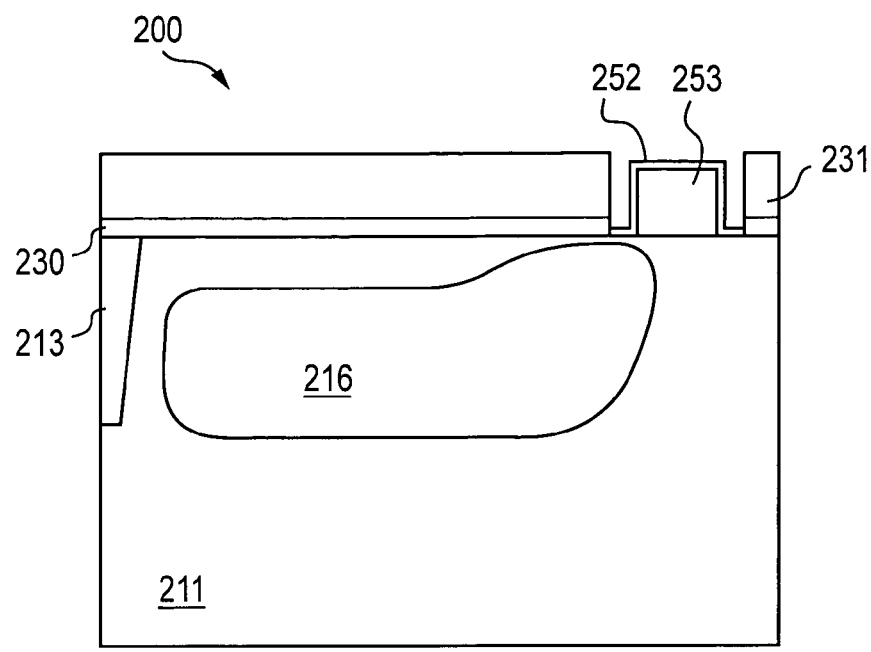

As shown in FIG. 3G, the oxide spacer 233 is removed and the gate dielectric 252 is grown or deposited surrounding the pillar 253 and on the substrate 211 in the trench 232. The gate dielectric 252 is formed to a thickness within the range of approximately 40 Å to approximately 100 Å. The gate dielectric 252 can be a conformal oxide, for example, an in-situ steam generated (ISSG) oxide. Alternatively, the gate dielectric 252 can be a high-k dielectric, for example, hafnium oxide ($HfO_2$) or zirconium oxide ($ZrO_2$) conformally deposited; or a composite material, such as, for example, a first layer of silicon oxide ($SiO_2$), preferably within the range of approximately 5 Å to approximately 15 Å thick, and a second layer of a high-k dielectric.

Figure 3H:
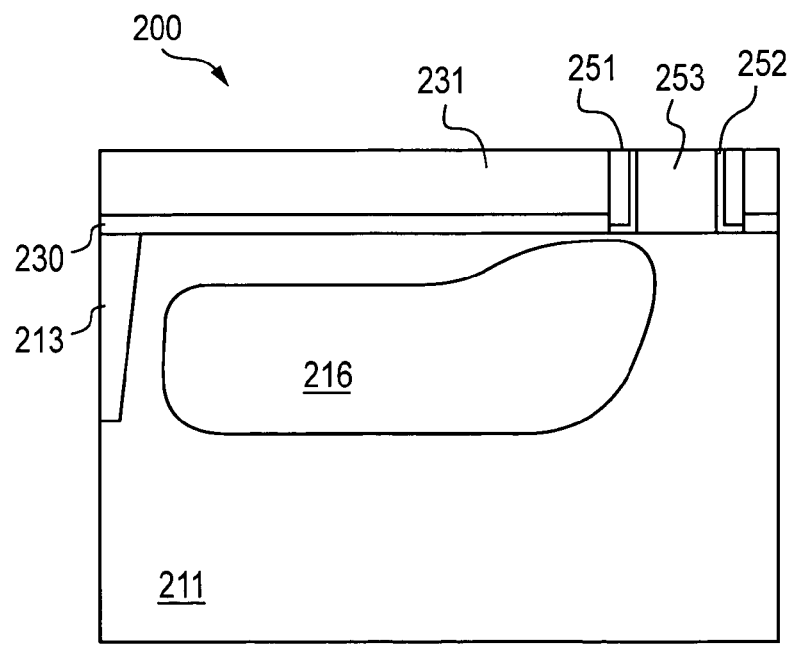

FIG. 3H depicts the deposition of an in-situ n-type doped layer of polysilicon to fill the trench and to form the gate 251. The polysilicon layer 251 and gate dielectric layer 252 are patterned and etched to expose the pillar 253.

In an alternative embodiment of the invention, the gate 251 is a metal gate. For example, the gate 251 can be formed of titanium nitride (TiN), titanium silicide ($TiSi_x$), tungsten (W), tungsten silicide ($WSi_x$), nickel (Ni), nickel silicide ($NiSi_x$), cobalt silicide, molybdenum (Mo), molybdenum silicide ($MoSi_x$), tantalum (Ta), tantalum silicide ($TaSi_x$), among others.

Figure 3I:
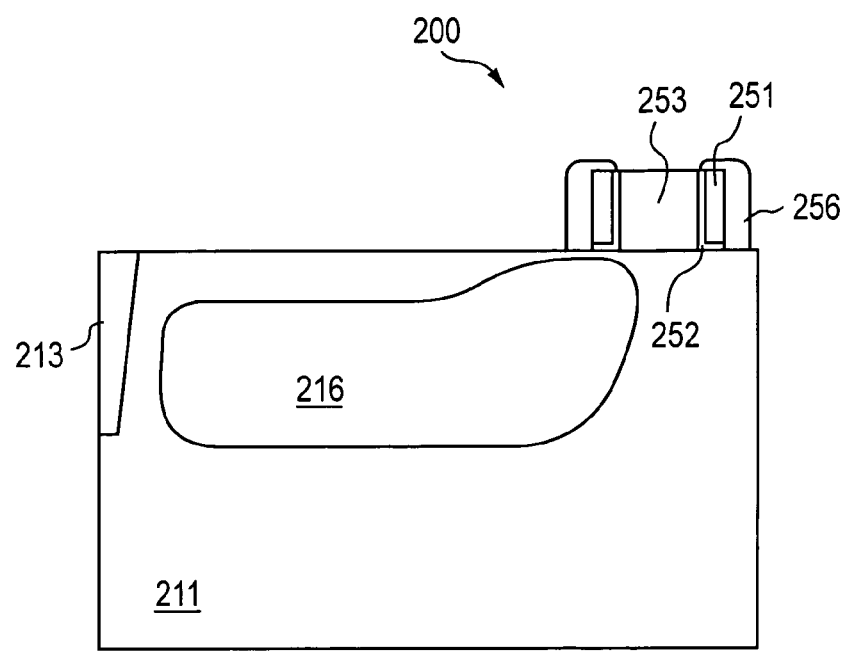

The hard mask 231 and pad oxide 230 are removed by any suitable technique, as shown in FIG. 3I. Also, an oxide layer 256 is formed on the sidewalls and top surface of the gate 251 to serve as sidewall spacers. The layer 256 is an oxide layer, but layer 256 may be any appropriate dielectric material, such as silicon dioxide, silicon nitride, an oxynitride, or tetraethyl orthosilicate (TEOS), among others, formed by methods known in the art. The layer 256 can have a thickness of approximately 700 Å.

Figure 3J:
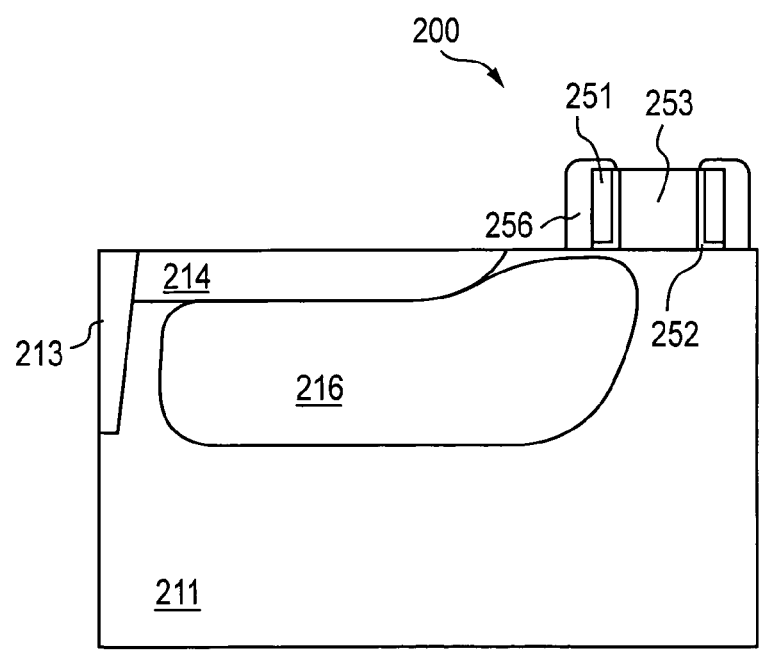

A heavily doped p-type surface layer 214 is formed over the n-type region 216, as shown in FIG. 3J. A p-type dopant, such as boron, indium, or any other suitable p-type dopant, may be used to form the p-type surface layer 214. The p-type surface layer 214 can be formed by known techniques. For example, layer 214 can be formed by implanting p-type ions through openings in a layer of photoresist. Alternatively, layer 214 can be formed by a gas source plasma doping process, or by diffusing a p-type dopant into the substrate 211 from an in-situ doped layer or a doped oxide layer deposited over the area where layer 214 is to be formed.

Figure 3K:
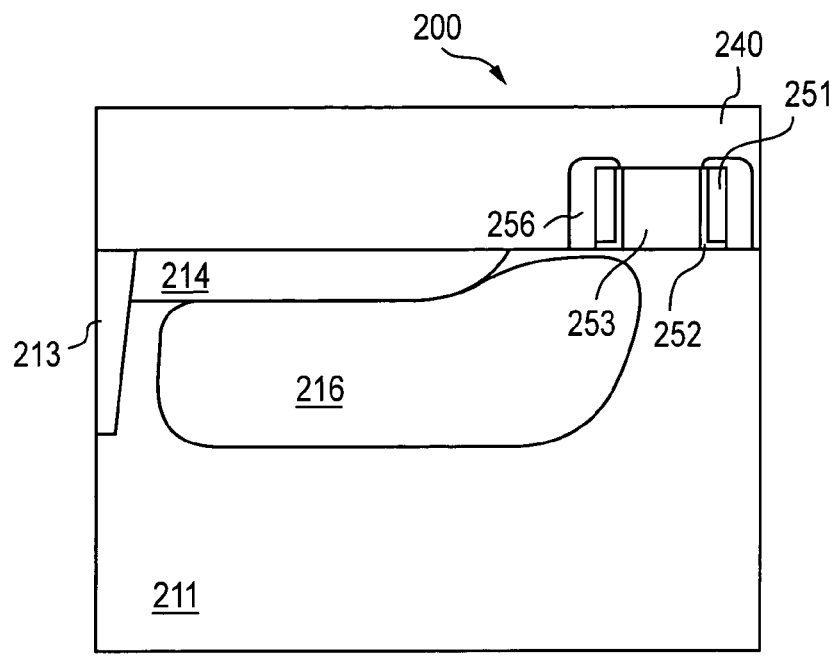
Figure 3L:
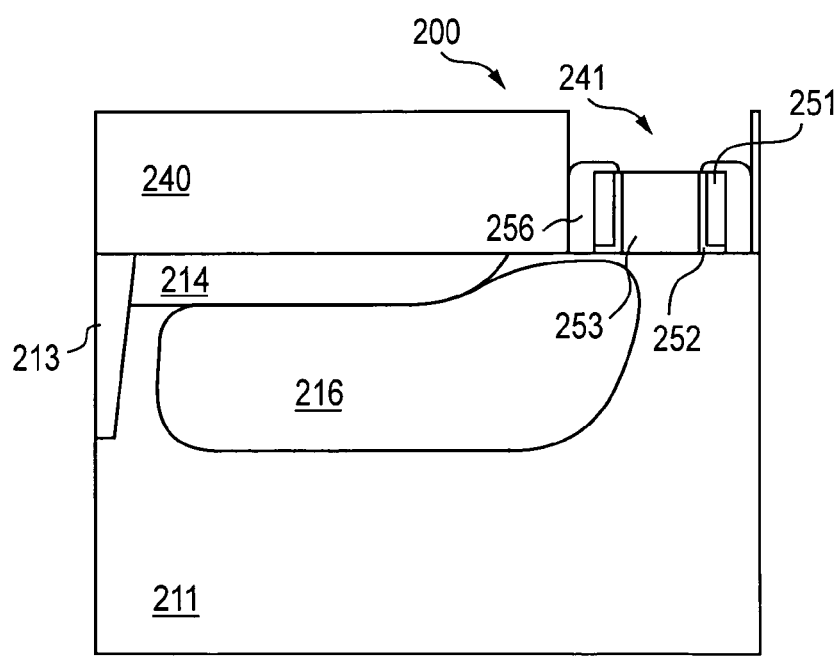

A dielectric layer 240 is formed over the substrate 211, gate 251 and pillar 253, as illustrated in FIG. 3K. The dielectric layer 240 can be, for example, a layer of TEOS. An opening 241 is formed in the dielectric layer 240 (FIG. 3L).

Figure 3M:
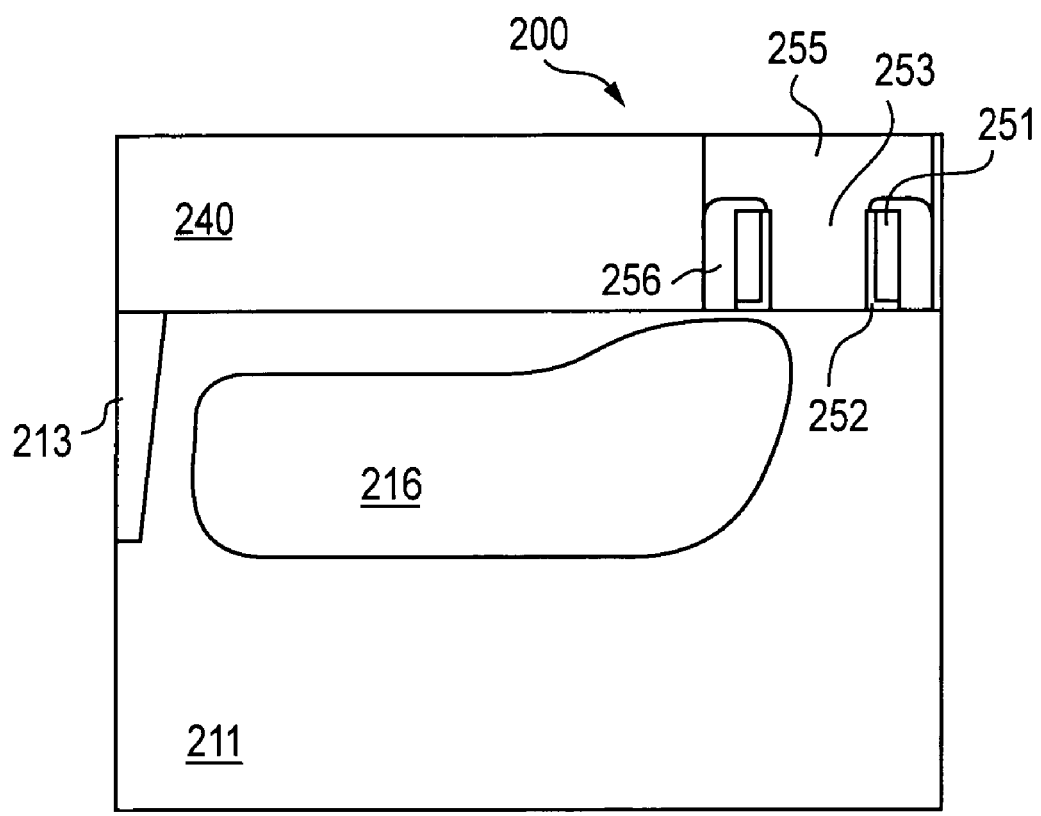

As depicted in FIG. 3M, a heavily doped polysilicon plug 255 is formed in the opening 241. In the illustrated embodiment, the polysilicon plug 255 is heavily doped with an n-type dopant, such as phosphorus, arsenic, or antimony. The polysilicon plug 255 serves as the floating diffusion region 255.

Conventional processing methods may be used to form other structures of the pixel cell 200. For example, lightly doped source/drain regions (not shown) can be formed by dopant implantation or the diffusion of dopants from a solid-source as is known in the art. Also, insulating, shielding, and metallization layers to connect gate lines and other connections to the pixel cell 200 may be formed. Specifically, a gate line can be connected to the gate 251. Also, the entire surface may be covered with a passivation layer (not shown) of, for example, silicon dioxide, borosilicate glass (BSG), phosphosilicate glass (PSG), or borophosphosilicate glass (BPSG), which is CMP planarized and etched to provide contact holes, which are then metallized to provide connections (e.g., metal lines 20). Conventional layers of conductors and insulators may also be used to interconnect the structures and to connect pixel cell 200 to peripheral circuitry.

It should be noted that, the transfer transistor 250 can be formed before or after the conventional planar transistors 25, 26, 27 of the pixel cell 200 or conventional planar transistors of peripheral circuitry (e.g., circuitry outside the array 680 (FIG. 6)). Preferably, the transfer transistor 250 is formed subsequent to the formation of the planar transistors 25, 26, 27.

While the above embodiment is described in connection with the formation of pnp-type photodiodes the invention is not to be so limited. The invention has applicability to other types of photodiodes and to photodiodes formed from npn regions in a substrate. If an npn-type photodiode is formed the dopant and conductivity types of all structures would change accordingly, with the transfer transistor being a PMOS transistor, rather than an NMOS transistor as in the embodiments described above.

Figure 4A:
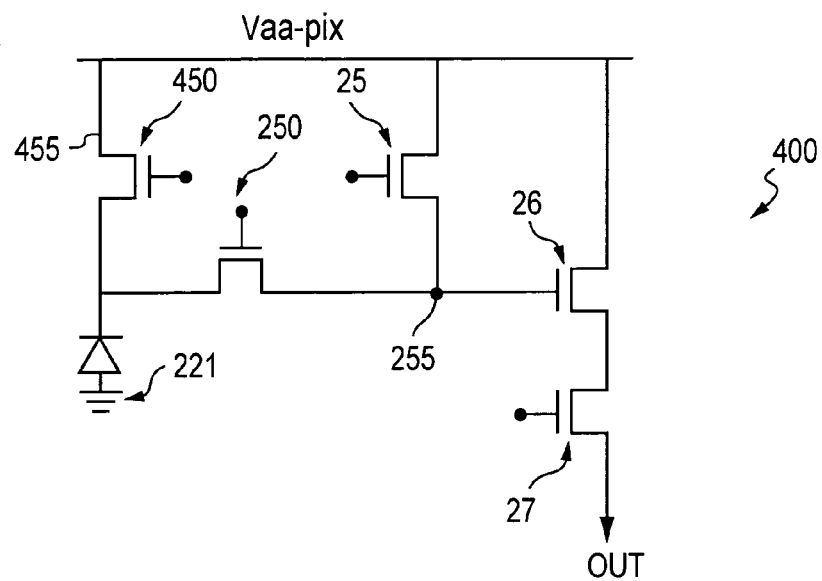
FIG. 4A is a schematic diagram of a pixel cell according to another exemplary embodiment of the invention.
Figure 4B:
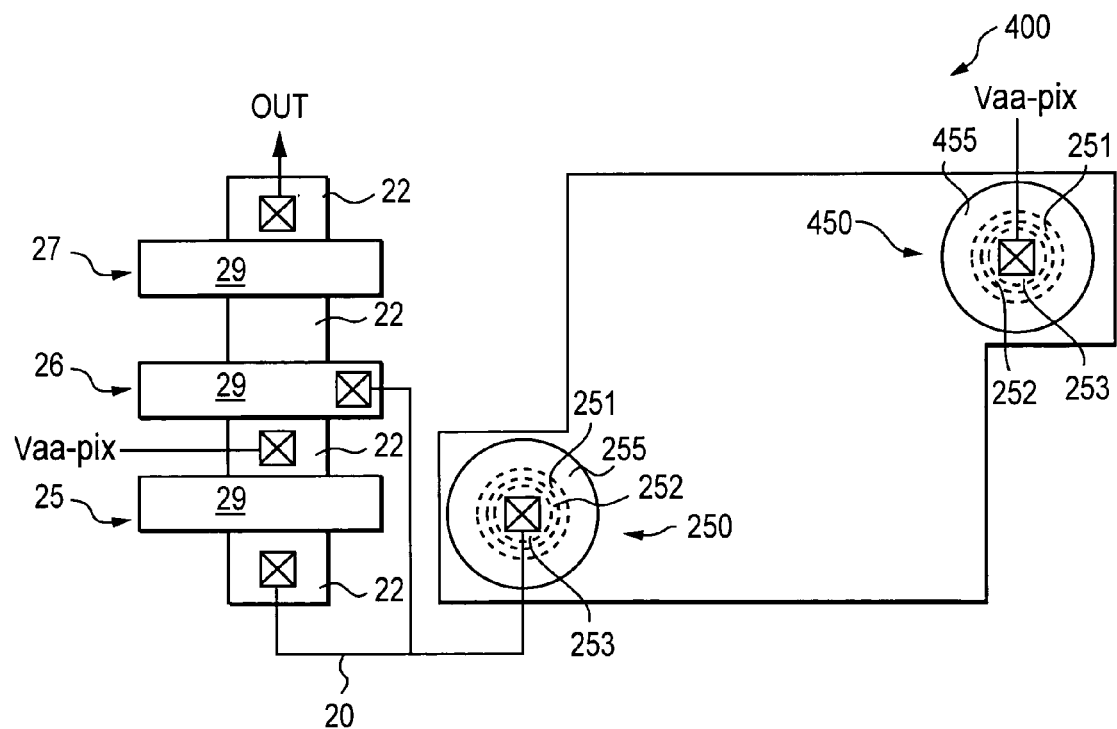
FIG. 4B is a top plan view of the pixel cell of FIG. 4A.

FIGS. 4A and 4B depict a pixel cell 400 according to another exemplary embodiment of the invention. The pixel cell 400 is similar to the pixel cell 200, except that the pixel cell 400 includes an anti-blooming transistor 450. Like the transfer transistor 250, the anti-blooming transistor 450 includes a vertical gate 251 surrounding a pillar 253, which serves as a channel region for the transistor 450. The anti-blooming transistor 450 includes a source/drain region 455 over the vertical gate. The pixel cell 400 can be fabricated as described above in connection with FIGS. 3A-3M, but with additional processing steps to form the transistor 450, which can be formed similarly to transistor 250. Preferably, transistors 250 and 450 are formed concurrently.

Although the above embodiment is described in connection with a 5T pixel cell 400, the invention may also be incorporated into other pixel circuits having different numbers of transistors, such as a 6T pixel cell. In such additional embodiments, any transistor coupled to the photo-conversion device has a vertical gate structure.

Figure 5:
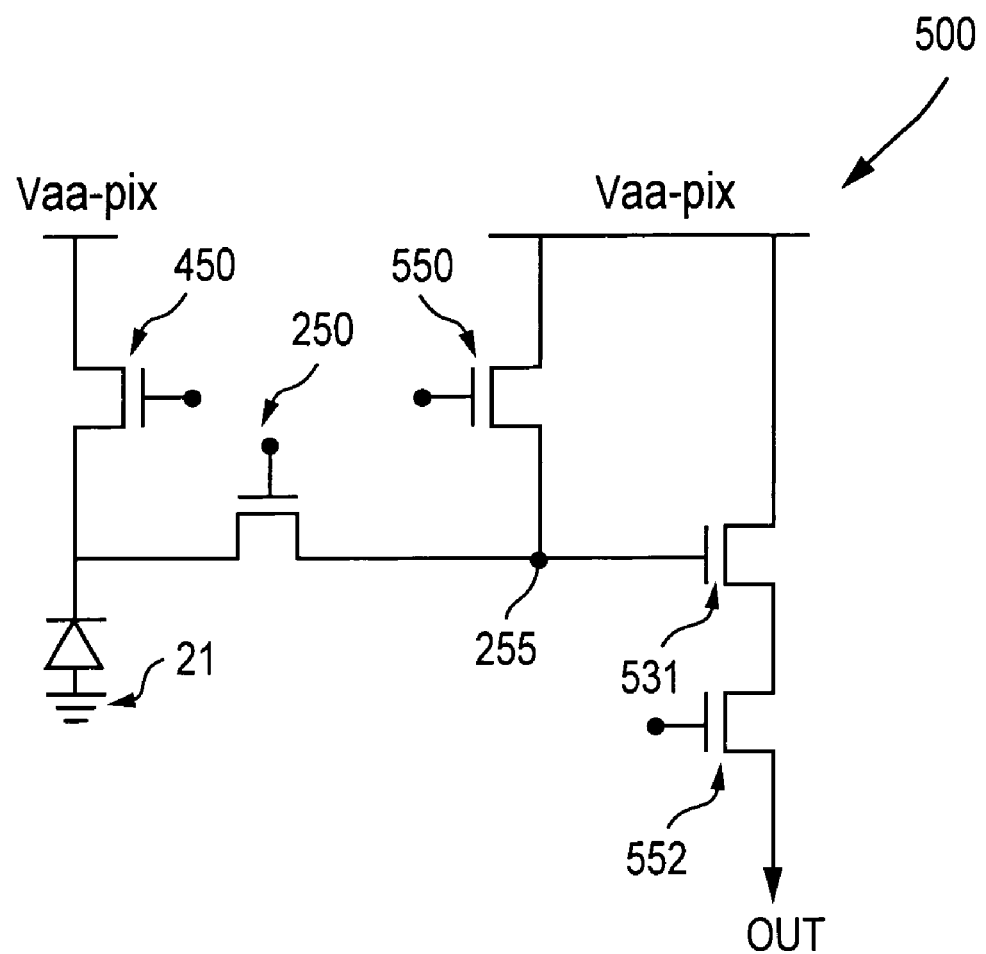
FIG. 5 is a schematic diagram of a pixel cell according to another exemplary embodiment of the invention.

FIG. 5 depicts a pixel cell 500 according to another exemplary embodiment of the invention. The pixel cell 500 is similar to the pixel cell 400, except that all transistors in the pixel cell 500 have vertical gate structures. Accordingly, the pixel cell 500 includes a transfer transistor 250, an anti-blooming transistor 450, a reset transistor 550, a source follower transistor 531, and a row select transistor 552. The pixel cell 500 can be fabricated as described above in connection with FIGS. 3A-3M, but with additional processing steps to form the transistors 450, 550, 531, 552 which can be formed similarly to the transistor 250. Preferably, transistors 250, 450, 550, 531, and 552 are formed concurrently.

Although the above embodiment is described in connection with a 5T pixel cell 500, the invention may also be incorporated into other pixel circuits having different numbers of transistors, such as a 4T or a 6T pixel cell. In such additional embodiments, all transistors within a pixel cell would have vertical gate structures.

Figure 6:
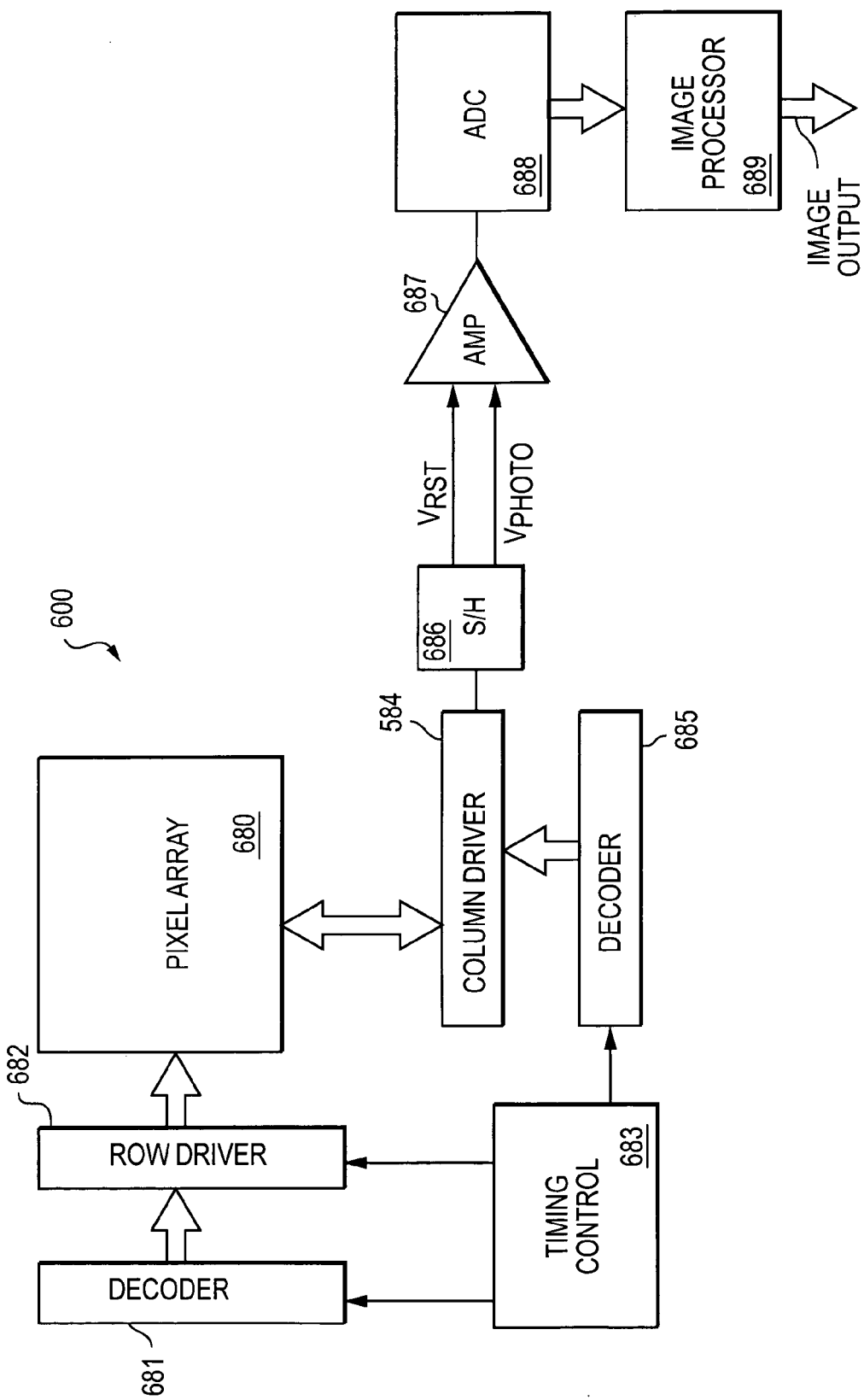
FIG. 6 is a block diagram of a CMOS imager according to another exemplary embodiment of the invention.

A typical single chip CMOS image sensor 600 is illustrated by the block diagram of FIG. 6. The image sensor 600 includes a pixel cell array 680 having one or more pixel cells 200, 400, or 500 described above. The pixel cells of array 680 are arranged in a predetermined number of columns and rows.

The rows of pixel cells in array 680 are read out one by one. Accordingly, pixel cells in a row of array 680 are all selected for readout at the same time by a row select line, and each pixel cell in a selected row provides a signal representative of received light to a readout line for its column. In the array 680, each column also has a select line, and the pixel cells of each column are selectively read out in response to the column select lines.

The row lines in the array 680 are selectively activated by a row driver 682 in response to row address decoder 681. The column select lines are selectively activated by a column driver 684 in response to column address decoder 685. The array 680 is operated by the timing and control circuit 683, which controls address decoders 681, 685 for selecting the appropriate row and column lines for pixel signal readout.

The signals on the column readout lines typically include a pixel reset signal ($V_{rst}$) and a pixel image signal ($V_{photo}$) for each pixel cell. Both signals are read into a sample and hold circuit (S/H) 686 in response to the column driver 684. A differential signal ($V_{rst}-V_{photo}$) is produced by differential amplifier (AMP) 687 for each pixel cell, and each pixel cell's differential signal is amplified and digitized by analog-to-digital converter (ADC) 688. The analog-to-digital converter 688 supplies the digitized pixel signals to an image processor 689, which performs appropriate image processing before providing digital signals defining an image output.

Figure 7:
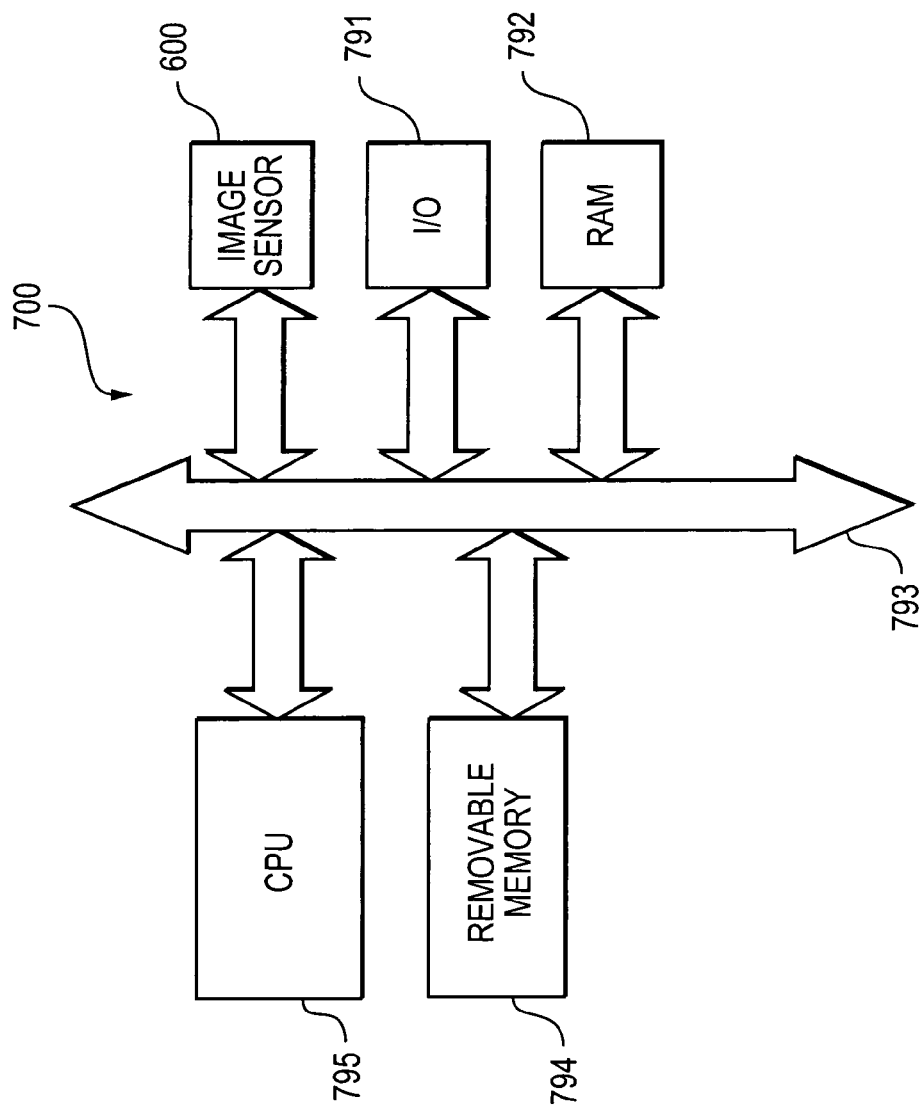
FIG. 7 is a diagram of a processor system incorporating the CMOS image sensor of FIG. 6.

FIG. 7 illustrates a processor-based system 700 including the image sensor 600 of FIG. 6. The processor-based system 700 is exemplary of a system having digital circuits that could include image sensor devices. Without being limiting, such a system could include a computer system, camera system, scanner, machine vision, vehicle navigation, video phone, surveillance system, auto focus system, star tracker system, motion detection system, image stabilization system, and data compression system.

The processor-based system 700, for example a camera system, generally comprises a central processing unit (CPU) 795, such as a microprocessor, that communicates with an input/output (I/O) device 791 over a bus 793. Image sensor 600 also communicates with the CPU 795 over bus 793. The processor-based system 700 also includes random access memory (RAM) 792, and can include removable memory 794, such as flash memory, which also communicate with CPU 795 over the bus 793. Image sensor 600 may be combined with a processor, such as a CPU, digital signal processor, or microprocessor, with or without memory storage on a single integrated circuit or on a different chip than the processor.

It is again noted that the above description and drawings are exemplary and illustrate preferred embodiments that achieve the objects, features and advantages of the present invention. It is not intended that the present invention be limited to the illustrated embodiments. Any modification of the present invention which comes within the spirit and scope of the following claims should be considered part of the present invention.

What is claimed as new and desired to be protected by Letters Patent of the United States is:

1. A pixel cell comprising:
   a substrate;
   a photo-conversion device comprising a first photodiode region doped with a first dopant formed at a surface of the substrate and a second photodiode region doped with a second dopant formed below the first photodiode region, wherein the second photodiode region comprises a lower source/drain region extending beyond an end of the first photodiode region and arranged adjacent to a surface of the substrate; and
   a first transistor formed on the substrate, the first transistor comprising a channel region arranged over the lower source/drain region, a gate surrounding the channel region, and an upper source/drain region arranged over the channel region.

2. The pixel cell of claim 1, further comprising a plurality of transistors, each transistor comprising a channel region surrounded by a gate and an upper source/drain region over the channel region.

3. A processor-based system comprising:
   (i) a processor; and
   (ii) an image sensor coupled to the processor, the image sensor comprising:
       a substrate,
       an array of pixel cells at a surface of the substrate, at least one of the pixel cells comprising:
       a photo-conversion device at a surface of the substrate, and
       a transistor having a lower source/drain region coupled to the photo-conversion device, a channel region surrounded by a gate and an upper source/drain region over the channel region.

4. A pixel cell comprising:
   a substrate;
   a photo-conversion device formed at a surface of the substrate; and
   a first transistor having a first lower source/drain region coupled to the photo-conversion device, a first channel region surrounded by a first gate and a floating diffusion region arranged over the first channel region.

5. An image sensor comprising:
   an array of pixel cells at a surface of a substrate, at least one of the pixel cells comprising:
   a photo-conversion device formed at a surface of the substrate, and
   a transistor having a lower source/drain region coupled to the photo-conversion device, a channel region surrounded by a gate and an upper source/drain region over the channel region.

6. The image sensor of claim 5, wherein the channel region has approximately no dopant concentration.

7. The image sensor of claim 5, wherein the channel region comprises a pillar.

8. The image sensor of claim 7, wherein the pillar has an approximately circular cross-sectional shape.

9. The image sensor of claim 7, wherein the pillar has an approximately oval cross-sectional shape.

10. A pixel cell comprising:
    a substrate;
    a photo-conversion device formed at a surface of the substrate; and
    a first transistor having a first lower source/drain region coupled to the photo-conversion device, a first channel region surrounded by a first gate and a first upper source/drain region over the first channel region.

11. The pixel cell of claim 10, wherein the first channel region comprises a pillar.

12. The pixel cell of claim 10, wherein the first channel region has approximately no dopant concentration.

13. The pixel cell of claim 10, wherein the first channel region comprises a same material as the substrate.

14. The pixel cell of claim 10, wherein the first gate comprises polysilicon.

15. The pixel cell of claim 10, wherein the first gate comprises metal.

16. The pixel cell of claim 10, wherein the first lower source/drain region is heavily doped and shallow.

17. The pixel cell of claim 10, wherein the first lower source/drain region is formed by a low energy implant of less than 5 keV or by the diffusion of a second dopant from a solid source.

18. The pixel cell of claim 10, wherein the first lower source/drain region has an active dopant concentration greater than about $1 \times 10^{17}$ atoms/cm$^3$.

19. The pixel cell of claim 11, wherein the pillar has an approximately oval cross-sectional shape.

20. The pixel cell of claim 19, wherein the pillar has an approximately circular cross-sectional shape.

21. The pixel cell of claim 10, further comprising a second transistor formed on the substrate, the second transistor having a first source/drain region coupled to the first upper source/drain region of the first transistor.

22. The pixel cell of claim 21, wherein a second source/drain region of the second transistor is coupled to a voltage supply such that the second transistor is configured to reset the first upper source/drain region of the first transistor to a predetermined voltage.

23. The pixel cell of claim 10, further comprising a second transistor, the second transistor having a second lower source/drain region coupled to the photo-conversion device, a second channel region surrounded by a second gate and a second upper source/drain region over the second channel region.

24. The pixel cell of claim 23, wherein the second transistor is configured to drain excess charge from the photo-conversion device.

25. The pixel cell of claim 10, further comprising an oxide layer surrounding the first channel region and being between the first channel region and the first gate.

26. The pixel cell of claim 25, wherein the oxide layer is an in-situ steam generated oxide layer.

27. The pixel cell of claim 25, wherein the oxide layer has a dielectric constant higher than a dielectric constant of silicon dioxide.

* * * * *